United States Patent [19]
Kosugi

[11] Patent Number: 5,568,343
[45] Date of Patent: Oct. 22, 1996

[54] CIRCUIT FOR PROTECTING SWITCHING POWER SOURCE FROM OVERLOADS AND SHOT CIRCUITS

[75] Inventor: Mitsuo Kosugi, Hamamatsu, Japan

[73] Assignee: Hamamatsu Photonics K.K., Shizuoka-ken, Japan

[21] Appl. No.: 325,591

[22] Filed: Oct. 19, 1994

[30] Foreign Application Priority Data

Oct. 19, 1993 [JP] Japan .................................. 5-260938

[51] Int. Cl.6 .................................................. H02H 7/04
[52] U.S. Cl. .............................. 361/36; 361/83; 361/94; 361/101; 363/80
[58] Field of Search ........................... 361/35–36, 78–79, 361/83, 86–87, 89, 93–94, 101, 111; 323/274–277, 284–285; 363/80, 89

[56] References Cited

U.S. PATENT DOCUMENTS

| | | | |
|---|---|---|---|
| 3,634,728 | 1/1972 | Moury | 361/54 |
| 3,855,520 | 12/1974 | Stich | 323/283 |
| 4,678,984 | 7/1987 | Henze | 323/285 |
| 5,297,014 | 3/1994 | Saito et al. | 363/21 |

FOREIGN PATENT DOCUMENTS

| | | |
|---|---|---|
| 2703858 | 10/1994 | France . |
| 3732334 | 4/1989 | Germany . |

*Primary Examiner*—Jeffrey A. Gaffin
*Assistant Examiner*—Michael J. Sherry
*Attorney, Agent, or Firm*—Sughrue, Mion, Zinn, Macpeak & Seas

[57] ABSTRACT

A protective circuit is used in conjunction with a switching power source for protecting the latter from overload and from short circuits. It is detected whether the current at the primary winding current of a switching power source transformer, the load current of the switching power source, or both exceed predetermined reference voltages. If so, supply of power to the switching power source is interrupted for a predetermined period of time, thereby bringing the switching power source into inoperable condition in this duration.

21 Claims, 4 Drawing Sheets

CIRCUIT FOR PROTECTING SWITCHING POWER SOURCE FROM OVERLOADS AND SHOT CIRCUITS

BACKGROUND OF THE INVENTION

1. Field of the Invention

The present invention relates to a circuit for protecting a switching power source from an overload condition or a short circuit condition by detecting a load current of the switching power source or a current flowing in the primary winding of a transformer included in the switching power source.

2. Description of the Prior Art

Recently, switching power sources have been commonly brought into use because they are a highly efficient means for providing a stable power supply. There are many types of switching power sources. As described in "Transistor Technology Special No. 28", the switching power sources are classified as single type vs. push-pull types and as self-excited types vs. separate-excited types in terms of power transistor's circuit configuration. To attain stabilized control, PWM types, RCC types or the like are used.

Generally, these circuits are designed to have protective characteristics for protecting the power transistor or the power FET coupled to the transformer from being damaged when a switching power source is overloaded or when the output of the circuit is short circuited.

A protective circuit for protecting from the overload condition or the short circuit condition is described in Japanese Patent Publication Kokoku No. HEI-1-20808, wherein with respect to a switching power source with a PWM feedback control, a current flowing in a power transistor or a power FET is interrupted using a bistable multivibrator when an overcurrent flows in the load for a predetermined period of time.

In the protective circuit as described in the above publication, once an overcurrent is detected, the bistable multivibrator is set so that current does not flow in the power transistor or the power FET. Even after the overcurrent stops flowing, the protected component, that is, the power transistor or power FET will remain OFF until the protective circuit is manually reset. Because there is no automatic reset function, the protective circuit is very troublesome to use. In addition, an overcurrent condition is not detected unless it continues for the predetermined period of time. Therefore, response is slow for detecting continuous short circuits. Also, the circuit has many components and is therefore complicated and expensive to produce.

SUMMARY OF THE INVENTION

In view of the foregoing, it is an object of the present invention to provide a circuit for protecting a switching power source from overload condition or short circuit condition with a simple structure and good response.

In order to achieve the above and other objects, there is provided, according to one aspect of the present invention, a protective circuit for a switching power source. The switching power source includes switching means for switching an input voltage applied to the switching means, a transformer having a primary winding coupled to the switching means and a secondary winding, and rectifying means coupled to the secondary winding of the transformer. A load is connectable to the rectifying means. The protective circuit includes detecting means for detecting at least one of two occurrences, one being that a current flowing in the primary winding of the transformer exceeds a first predetermined reference value, and another being that a current flowing in the load connected to the rectifying means exceeds a second predetermined reference value, and interrupting means for interrupting application of the input voltage to the switching means for a predetermined period of time when the detecting means detects at least one of the two occurrences.

The detecting means includes first current detecting means for detecting the current flowing in the primary winding of the transformer and outputting a primary winding current indicative of the current detected by the first current detecting means, a second current detecting means for detecting the current flowing in the load connected to the rectifying means and outputting a load current indicative of the current detected by the second current detecting means, and comparison means for comparing the primary winding current with the first reference value and for comparing the load current with the second reference value, the comparison means outputting a trigger signal when comparison results indicate that at least one of the primary winding current and the load current exceeds the first reference value or the second reference value, and wherein the interrupting means interrupts application of the input voltage to the switching means in response to the trigger signal.

The first current detecting means includes a resistor coupled to the primary winding of the transformer so that the primary winding current flows in the resistor, and differentiating means for differentiating a voltage developed across the resistor to detect an inrush current flowing in the primary winding of the transformer immediately after the switching means of the switching power source is rendered ON.

The interrupting means includes a switching device connected to the switching means of the switching power source, control means connected to the switching device for controlling ON-OFF switchings of the switching device, and time measuring means connected to the control means for measuring the predetermined period of time upon the detecting means detecting at least one of the two occurrences. The control means renders the switching device OFF during the predetermined period of time measured by the time measuring means, whereby application of the input voltage to the switching means is interrupted for the predetermined period of time.

According to the present invention, in an overload or short circuit situation when the primary winding current or the load current exceeds the above-described reference values, supply of power to the switching power supply is temporarily interrupted. After expiration of the predetermined period of time, if the primary winding current of the load current does not exceed the above-described reference values, power is supplied to the switching circuit. That is, the circuit automatically reverts to an operable condition.

If the above-described reference values are exceeded, supply of power to the switching power source is again temporarily interrupted. When either the primary winding current or the load current continues to exceed the above-described values, the operations of detecting the primary winding current and the load current and the interrupting the supply of power to the switching power source are repeatedly carried out at a frequency with a predetermined period of time. Therefore, a short frequency chattering does not occur in the circuit of the present invention.

According to another aspect of the present invention, there is provided a protective circuit which includes detecting means for detecting that at least one of a current flowing in the primary winding of the transformer and a current flowing in the load connected to the rectifying means exceeds a predetermined reference value, and interrupting means for interrupting application of the input voltage to the switching means for a predetermined period of time when the detecting means detects at least one of the two occurrences.

BRIEF DESCRIPTION OF THE DRAWINGS

The above and other objects, features and advantages of the invention will become more apparent from reading the following description of the preferred embodiments taken in connection with the accompanying drawings, in which.

DETAILED DESCRIPTION OF THE PREFERRED EMBODIMENTS

Figure 1:
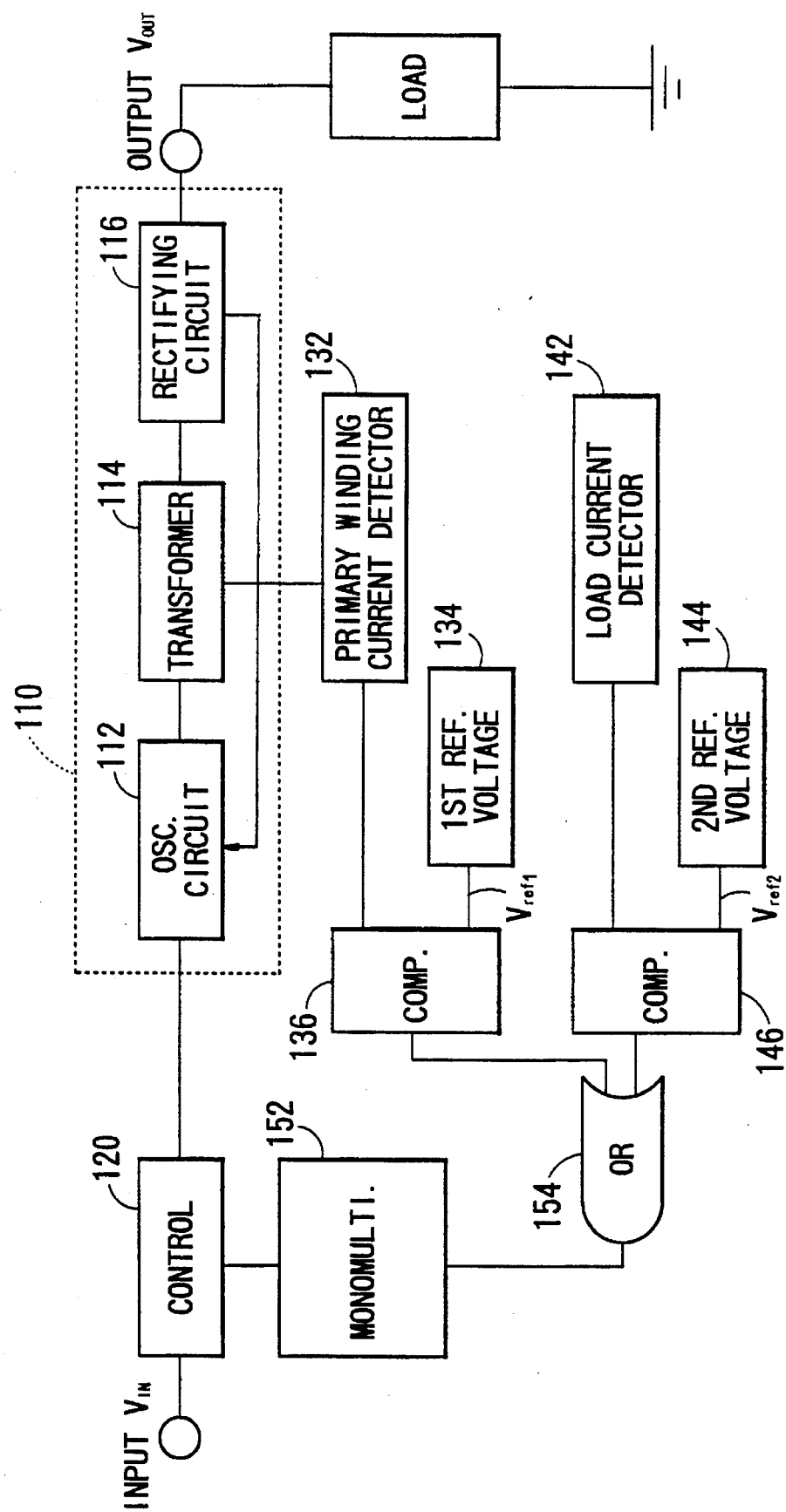
FIG. 1 is a block diagram showing a circuit for protecting against overloads and short circuits according to a first embodiment of the present invention.

Preferred embodiments of the present invention will be described with reference to the accompanying drawings. FIG. 1 is a block diagram showing the arrangement of a protective circuit for a switching power source of separate-excited and push-pull type. The switching power source is denoted by reference numeral 110 and includes an oscillation circuit 112, a transformer 114 and a rectifying circuit 116. As will be described in detail below, the oscillation circuit 112 includes a power transistor serving as a switching means for switching an input voltage $V_{IN}$ applied to the power transistor. The transformer 114 has a primary winding coupled to the power transistor and a secondary winding. The rectifying circuit 116 is coupled to the secondary winding of the transformer 116. A load is connectable to the output of the rectifying circuit 116.

The input voltage $V_{in}$ supplied from the power source is subjected to switching by the power transistor included in the oscillation circuit 112. After the input voltage $V_{in}$ is boosted at the transformer 114, it is rectified at the rectifying circuit 116 and outputted as stabilized output $V_{out}$. The output voltage $V_{out}$ is fed back by a feedback path 11 to the oscillation circuit 112 and stabilized by well-known PWM control.

The primary winding current flowing in the primary winding of the transformer 114 is detected by the primary winding current detector 132 and a translated voltage of the detected current is compared in a first comparator 136 with a first reference voltage $V_{ref1}$ supplied from first reference voltage supply 134. If the translated voltage of the detected primary winding current is greater than the first reference voltage $V_{ref1}$, a first detection signal is outputted from the first comparator 136.

The load current of the switching power source 110 is detected by a load current detector 142 and a translated voltage of the detected load current is compared in a second comparator 146 with a second reference voltage $V_{ref2}$ supplied from second reference voltage supply 144. If the translated voltage of the load current is greater than the second reference voltage $V_{ref2}$, a second detection signal is outputted from the second comparator 146. An OR gate 154 is connected to the outputs of the first and second comparators 136 and 146 to receive the first and second detection signals. The OR gate 154 ORs the first and second detection signals. That is, if either the first detection signal or the second detection signal is applied to the OR gate 154, the OR gate 154 outputs a trigger pulse to a monostable multivibrator 152 connected to the output of the OR gate 154. The primary winding current detector 132, the load current detector 142, the first and second reference voltage supplies 134 and 144, and the first and second comparators 136 and 146 serve as detecting means for detecting at least one of two occurrences. One is that a current flowing in the primary winding of the transformer 114 exceeds the first reference value. Another is that a current flowing in the load connected to the rectifying circuit 116 exceeds the second reference value.

When the monostable multivibrator 152 is triggered in response to the trigger pulse outputted from the OR gate 154, the monostable multivibrator 152 outputs a control pulse for a predetermined period of time to a control circuit 120 for controlling the supply of input voltage to the switching power source 110. Supply of input voltage through the control circuit 120 to the switching power source 110 is interrupted during the predetermined period of time. After the predetermined period of time elapses, the input voltage is again supplied to the switching power source 110. The primary winding current flowing in the primary winding of the transformer 114 is monitored by the primary winding current detector 132 and the load current is monitored by the load current detector 142. When a voltage corresponding to at least one of the primary winding current and the load current exceeds the reference voltages $V_{ref1}$ or $V_{ref2}$, the input voltage $V_{IN}$ to the switching power source 110 is interrupted.

The control circuit 120 is constructed from a transistor Tr120 serving as switching element which is controlled by a control pulse from the monostable multivibrator 152 in a manner to be described later. The control circuit 120, the monostable multivibrator 152, and OR gate 154 serve as interrupting means for interrupting application of the input voltage to the switching power source 110 for a predetermined period of time when the detecting means detects at least one of the two occurrences.

Figure 2:
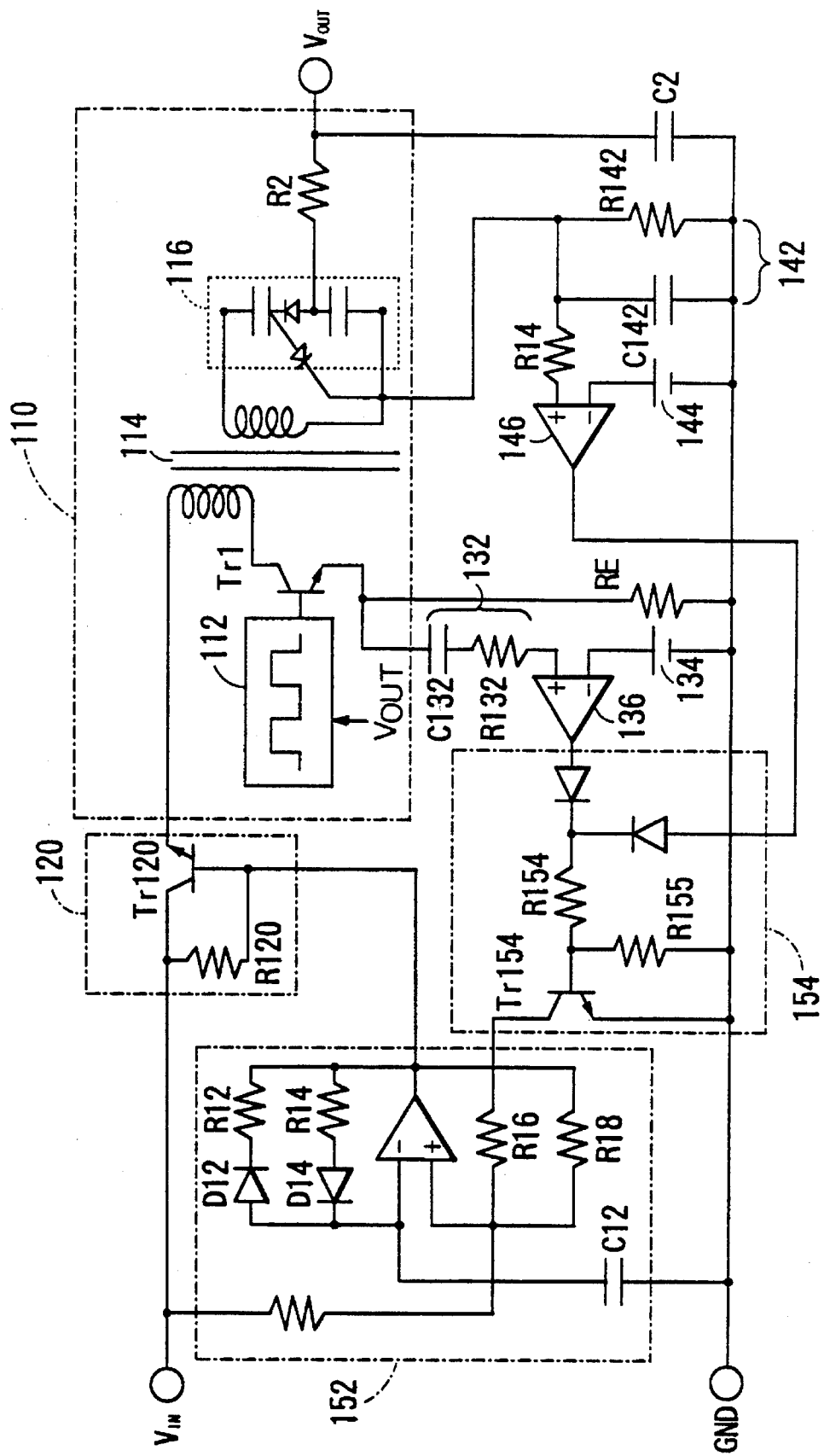
FIG. 2 is a circuit diagram of the block diagram shown in FIG. 1.

FIG. 2 shows an example of the circuit arrangement of the protective circuit shown in block form in FIG. 1. Components in FIG. 2 that are the same as in FIG. 1 are indicated with the same numbering.

A power transistor Tr1 is provided as the switch element of the switching power source 110. The current flowing in the primary winding of the transformer 114 is subjected to on-off switching by the power transistor Tr1 which is controlled by an oscillation circuit 112. A voltage doubler circuit for further boosting the voltage that is boosted by the transformer 114 is used in the rectifying circuit 116. The rectified output is applied via a resistor R2 to an output terminal to provide a stabilized output $V_{out}$. The output voltage $V_{out}$ is fed back to the oscillation circuit 112 to attain stabilized output voltage.

An emitter resistor RE of small resistance is connected to the emitter of the power transistor Tr1. When the power transistor Tr1 is turned ON in response to the rectangular wave from the oscillation circuit 112, a current flows in the primary winding of the transformer 114. A voltage in proportion to this primary winding current is developed across the emitter resistor RE. The primary winding current can be detected by differentiating the voltage developed across the emitter resistor RE. A series connection of capacitor C132 and resistor R132, which is denoted generally by reference numeral 132, is connected to the non-inverting input of the comparator 136 and performs the differentiation of the voltage across the emitter resistor RE. By providing the resistor R132 and the capacitor C132 with small values, a current starts flowing therein in timed relation to the rise of the voltage developed across the emitter resistor RE, and the capacitor C132 is thereby quickly charged, whereby a differentiated voltage of the voltage developed across the emitter resistor RE is applied to the non-inverting input of the comparator 136. Further, by using the emitter resistor Re with a small value, the capacitor C132 can also be discharged quickly.

If the voltage at the non-inverting input of the comparator 136 is greater than the first reference voltage 134 applied to the inverting input of the comparator 136, that is, if the primary winding current of the transformer is larger than the predetermined reference value, the output of the comparator 136 becomes high level. If, on the other hand, the voltage at the non-inverting input of the comparator 136 is less than the first reference voltage 134, the output of the comparator 136 becomes low level. The comparator 136 and the reference voltage 134 are constructed by well-known methods, so detailed description thereof will be omitted herein.

A small value resistor R142 and a smoothing capacitor C142, denoted generally by reference numeral 142, are connected to the output of the rectifying circuit 116. A voltage proportional to the load current is developed across the resistor R142 and the smoothing capacitor C142. The output of the comparator 146 becomes high level when the voltage at the non-inverting input of the comparator 146 is greater than the voltage at the inverting input of the comparator 146, that is, when the load current is greater than the predetermined reference value. Contrarily, the output of the comparator 146 will be at a low level when the voltage at its non-inverting input is less than the voltage at the inverting input. The structure of the comparator 146 and the reference voltage 144 are well known, so their description will be omitted herein.

As shown in FIG. 2, the OR gate 154 is constructed from a diode logic and an invertor by a transistor. When the primary winding current and the load current are greater than the associated reference values, the OR gate 154 outputs a trigger pulse to the monostable multivibrator 152. The trigger pulse is negative logic. Therefore, OR gate 154 is more accurately termed a NOR gate. Circuitry for making the monostable multivibrator 152 is well known in the art. The pulse width output from the monostable multivibrator 152 can be optionally determined by the selection of the capacitor C12 and resistors R12 and R14. The output of the monostable multivibrator 152 is also negative logic, that is, when input level is low, the transistor Tr1 120 is turned OFF whereas when input level is high, the transistor Tr1 120 is turned ON.

When the output of the switching power source 110 is short circuited or when the primary winding current or the load current exceed predetermined reference values, these are detected by the circuits 132 and 142, and a trigger pulse is outputted from the OR gate 154 to the monostable multivibrator 152. A low output from the monostable multivibrator 152 turns OFF the transistor Tr120. The current then stops flowing in the primary winding of the transformer 114 and output voltage from the switching power circuit 110 becomes unavailable.

After a predetermined period of time corresponding to the output pulse width of the monostable multivibrator 152 is expired, the monostable multivibrator 152 outputs a high level signal to the base of the transistor Tr120 so that the transistor Tr120 is turned ON. As a result, the operation of the switching power source 110 resumes, and the current flows in the primary winding of the transformer 114 and a stabilized power output is obtained.

The circuits 132 and 142 detect when a short circuit occurs or when the primary winding current and the load current are greater than predetermined reference values. The switching power source 110 again interrupts supply of power. If only the load current is detected and the primary winding current is not detected, the transistor Tr1 generates a large amount of heat when a large inrush current flows in the primary winding of the transformer 114. However, if the primary winding current is monitored together with the load current as in the present embodiment, an undue inrush current can be detected. By inhibiting the current from flowing in the primary winding of the transformer 114 for a predetermined period of time when the undue inrush current is detected, the average value of the current at the primary winding of the transformer 114 can be reduced so that the power transistor Tr1 will not be damaged by the heat generated.

Figure 3:
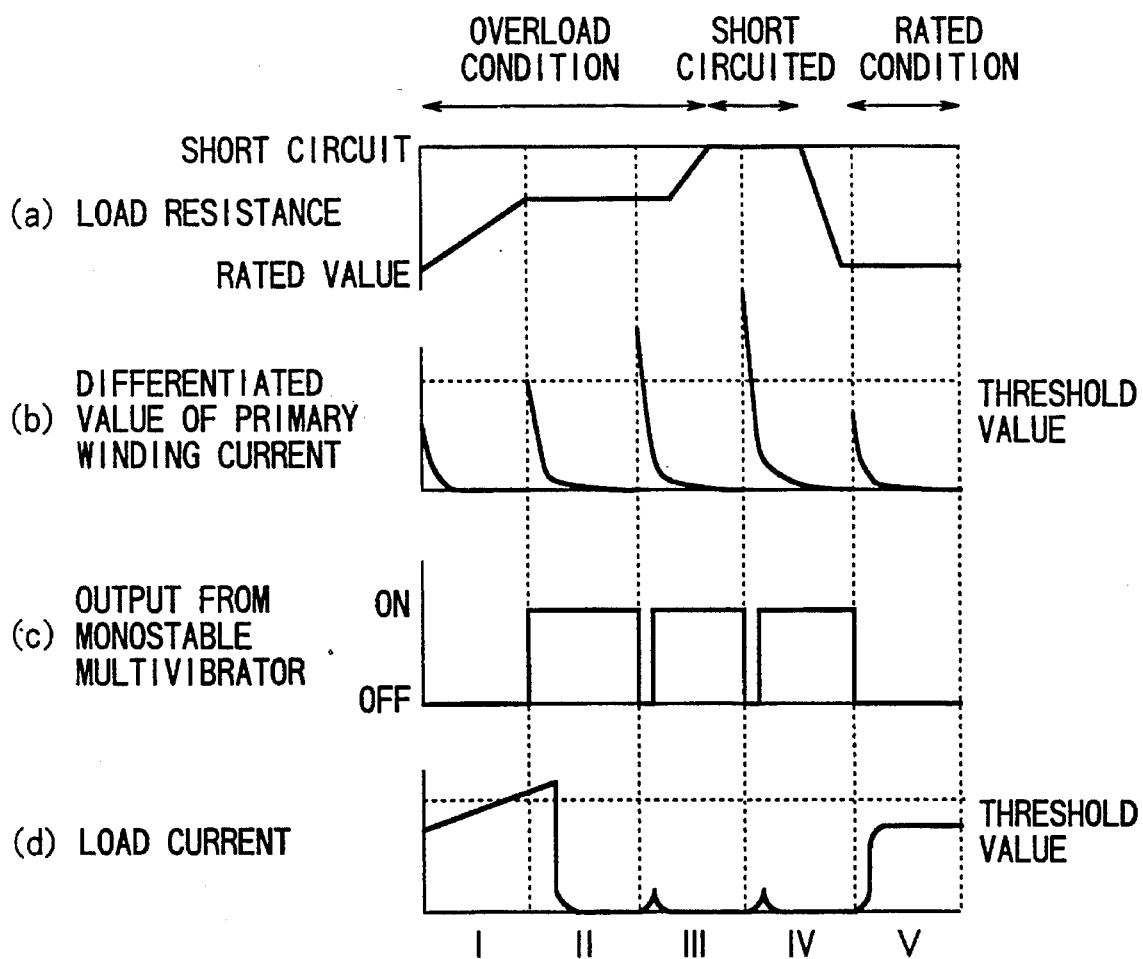
FIG. 3 is a diagram illustrating operation of the circuit according to the first embodiment of the present invention.

FIG. 3 shows how the non-inverting input of the comparator 136 (i.e., the differentiated value of the primary winding current), the output from the multivibrator 152, and the load current change with changes in the load. The upper level (a) indicates the load, wherein load increases with increasing height.

Region I shows the situation when the load exceeds a rated value. In this case, the load current (see lower level (d)) and the differentiated value of the primary winding current (see second level (b)) increase in comparison with the case where the load is at the rated value. The switching power source 110 operates almost as normal as a stabilized power source until the primary winding current or the load current exceeds the threshold value.

Region II shows the load increasing further. When the primary winding current or the load current exceeds a threshold value, the comparator 136 or 146 outputs at a high level signal, whereupon the OR gate 154 outputs the trigger pulse to the monostable multivibrator 152. The transistor Tr 120 is turned OFF for a predetermined period of time determined by the monostable multivibrator 152 and thus power supply to the switching power source 110 is interrupted.

During the overloaded condition, the monostable multivibrator 152 reverts to its original condition, whereup-on the transistor Tr 120 is again turned ON for a short period of time and the switching power source 110 operates. However, as shown in regions II through IV, due to large load continuously imposed, the primary winding current or the load current exceeds the threshold value. In this condition, the trigger pulse is outputted to the monostable multivibrator 152 upon detection of the primary winding current or the load current. The transistor Tr120 will again be turned OFF for the predetermined period of time. During overloaded or short circuited condition, the switching power source 110 operates for an extremely short period of time. As indicated in regions III and IV, when the load further increases and the output of the switching power source 110 is brought to short-circuited condition, the primary winding current will increase and the switching power source 110 will only operate for extremely short periods of time.

Region V shows conditions when the load returns to the rated level. Because the primary winding current and the load current are lower than the respective threshold values, the transistor Tr120 is ON and thus the switching power source 110 operates. In this way, the circuit automatically returns to the operable condition following an inoperable condition continuing for the predetermined period of time when both the load current and the primary winding current return to the normal level. Further, as described, when an overload or a short circuit condition is continuing, the time period at which the switching power source 110 operates is extremely short so that damage from generation of heat is prevented. Thus, the switching power source 110 is protected by a circuit of a simple arrangement and automatically returned to the operable condition after a protective period of time.

The average current at the primary winding during a short circuit of the output of the switching power source 110 can be set to 1/10 of the current flowing in the rated load by appropriately setting the pulse width of the monostable multivibrator 152 by selection of capacitor C12 and resistances R12 and R14.

Figure 4:
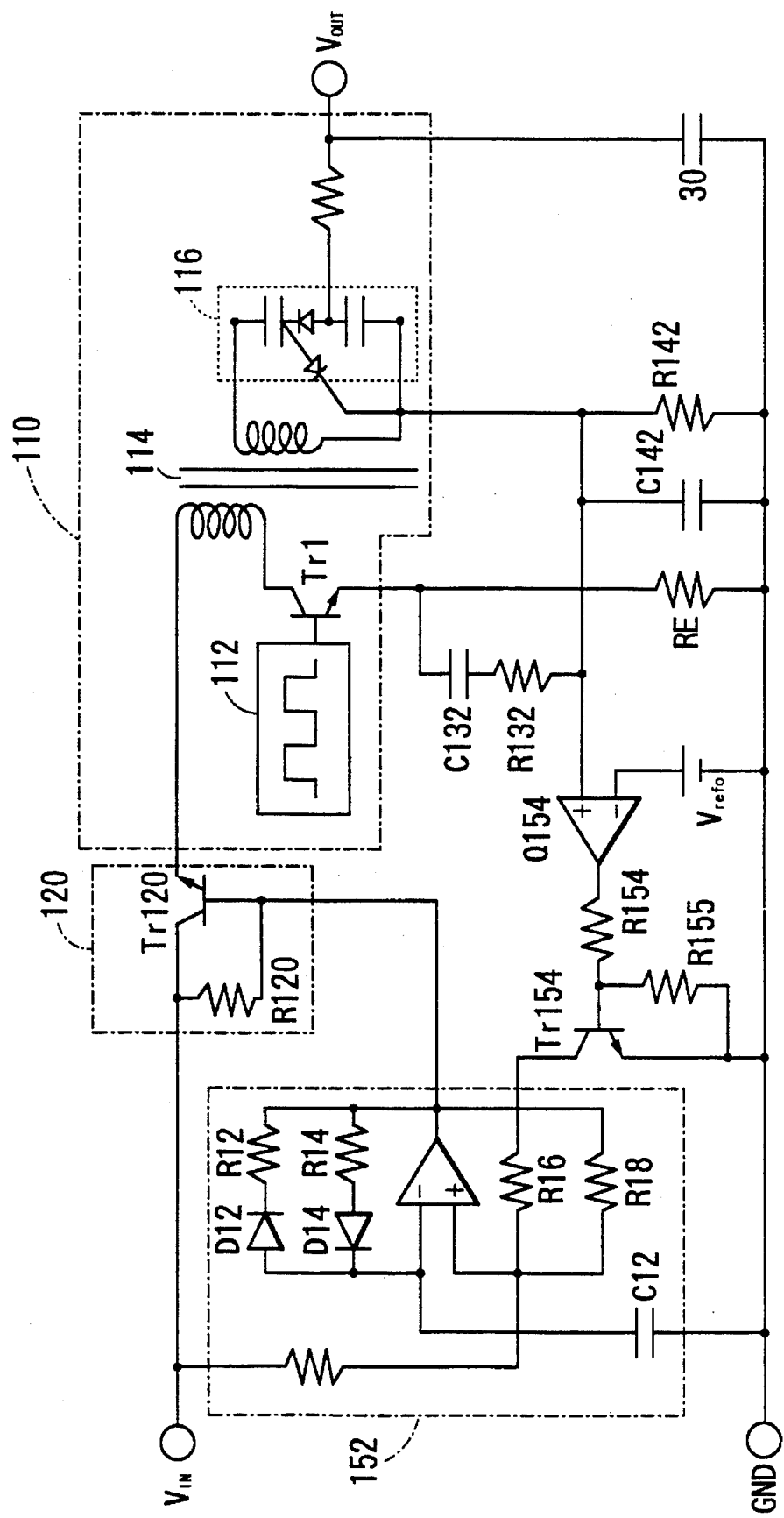
FIG. 4 is a circuit diagram showing a circuit diagram according to a second embodiment of the present invention.

FIG. 4 shows another example of circuit arrangement wherein like components are provided with the same numbering as in FIGS. 1 and 2. In the example shown in FIGS. 1 and 2, the comparison results of two comparators 136 and 146 are ORed. In the arrangement shown in FIG. 2, the set values of the current at the primary winding and the load current are freely determined by appropriately determining the reference voltages 134 and 144.

The circuit arrangement can be simplified by appropriately selecting the emitter resistance RE and the resistance R142 so that the reference voltages 134 and 144 can be set to the same value. To this end, in the circuit arrangement shown in FIG. 4, by applying an added value of the detection results from the primary winding current detector 132 and the load current detector 142 to the non-inverting input of the comparator 136, a trigger pulse is outputted to the monostable multivibrator 152 depending on whether the current at the primary winding of the transformer or the load current has exceeded the respective reference values.

In the circuit shown in FIG. 4, the resistor R132 and the capacitor C132 connected to the non-inverting input of the comparator Q154 are for differentiating the voltage developed at the emitter resistor RE as in FIG. 2. Further, the resistor R142 and the capacitor C142 are provided for detecting load current of the rectifying circuit 116. The detection output from the resistor R132, the capacitor C132, the resistance R142, and the capacitor C142 is applied to the non-inverting input of the comparator Q154. If the non-inverting input of the comparator Q154 is greater than the reference voltage $V_{ref0}$ inputted to the inverting input of the comparator Q154, that is, if the current at the primary winding of the transformer 114 or the load current is greater than the predetermined reference value, the comparator Q154 outputs a high level signal. If not, the comparator Q154 outputs a low level signal. In this circuit, the reference value is set to a level that is 130% of the rated load. The transistor Tr120 is subjected to ON-OFF control in the same manner as described with reference to FIG. 2. Because the resistors R132 and R142 are provided with relatively small values, the capacitor promptly discharges.

This circuit operates substantially the same as that shown in FIG. 2. Consequently, when load conditions are changed as shown in FIG. 3(a), the differentiated value of the primary winding current, the output from the multivibrator, and the load current also change as shown in FIG. 3. When the primary winding current become 130% or more than the current under the rated load, the transistor Tr120 is turned OFF as shown in regions II and on.

If detection is carried out with respect only to the load current and no detection is carried out with respect to the primary winding current, then the power transistor Tr1 will be damaged when overloads or short circuits occur, because a large inrush current that exceeds the 130% of the rated value flows in the primary winding of the transformer 114. However, in the arrangement of FIG. 4, inrush currents that exceed 130% of the rated value can be detected by the series connection of the capacitor C132 and resistor R132 so that damage of the power transistor Tr1 by the inrush currents can be prevented.

If only the differentiated value of the primary winding current is detected and the load current is not detected, the following problem will arise. When a rated load is provided, an inrush current flows in the primary winding when the power supply is started up but afterward the current at the primary winding of the transformer 114 becomes a half or less the inrush current. Therefore, different reference values need to be set to monitor the start up current and the current flowing in stationary states of the power source. If the same reference value is used to monitor the two statuses, the current flowing during the stationary states is checked whether it exceed a value two times or greater than the stationary state voltage operating under the rated load.

According to the circuit arrangement shown in FIG. 4, in a stationary state at the rated load, a current that depends on the load current flows in the resistor R142 and a corresponding voltage is developed thereacross. The voltage across the resistor R142 is 0 V when the power source is started up. By appropriately determining the constant of the circuit, the difference between the inrush current at the time the power starts under the rated load and the inrush current during an overload can be obtained and a reference value of 130% under the rated load can be set using an extremely simple structure for both the primary winding current of the transformer and for the load current. Further, when this reference value is exceeded, operations for protecting the switching power source 110 can be promptly performed.

According to the present invention, at least one of the primary winding current of the transformer and the load current is detected. Operations to interrupt supply of power are repeated at a frequency with a predetermined period of time. After the predetermined period of time has been expired, if the current at the primary winding of the transformer or the load current does not exceed the reference value, the switching element is turned ON, thereby causing the circuit to return to the operable condition. If the circuit is in an overload or short circuit condition, the switching power source is protected from heat damage by interrupting supply of power to the switching power source, thereby protecting the switching power source.

While exemplary embodiments of this invention have been described in detail, those skilled in the art will recognize that there are many possible modifications and variations which may be made in this exemplary embodiments while yet retaining many of the novel features and advantage of this invention. Accordingly, all such modifications and variations are intended to be included within the scope of the appended claims.

What is claimed is:

1. A protective circuit for a switching power source which includes a switching device which switches an input voltage applied to said switching device a transformer having a primary winding coupled to said switching device and a secondary winding, and a rectifier coupled to said secondary winding of said transformer, a load being connectable to said rectifier, said protective circuit comprising:

a detector circuit which compares a current flowing in said primary winding to a first predetermined reference value and a current flowing in said load to a second predetermined reference value to detect a first occurrence when said current flowing in said primary winding of said transformer exceeds said first predetermined reference value, and a second occurrence when said current flowing in the load connected to said rectifier exceeds said second predetermined reference value; and an interrupter which interrupts application of the input voltage to said switching device for a predetermined period of time when said detector circuit detects at least one of the two occurrences.

2. The protective circuit according to claim 1, wherein said detector circuit comprises a first current detector which detects the current flowing in said primary winding of said transformer and outputs a primary winding current indicative of the current detected by said first current detector a second current detector which detects the current flowing in the load connected to said rectifier and outputs a load current indicative of the current detected by said second current detector, and a comparator which compares the primary winding current with the first reference value and which compares the load current with the second reference value, said comparator outputting a trigger signal when comparison results indicate that at least one of the primary winding current and the load current exceeds the first reference value or the second reference value, and wherein said interrupter interrupts application of the input voltage to said switching device in response to the trigger signal.

3. The protective circuit according to claim 2, wherein said first current detector comprises a resistor coupled to said primary winding of said transformer so that the primary winding current flows in said resistor, and a differentiator which differentiates a voltage developed across said resistor to detect an inrush current flowing in said primary winding of said transformer immediately after said switching device of said switching power source is rendered ON.

4. The protective circuit according to claim 3, wherein said comparator comprises a first comparator which compares the primary winding current with the first reference value and provides a first comparison result, a second comparator which compares the load current with the second reference value and provides a second comparison result, and an OR gate having a first input connected to said first comparator to receive the first comparison result and a second input connected to said second comparator to receive the second comparison result, said OR gate outputting an ORed signal of the first comparison result and the second comparison result as the trigger signal.

5. The protective circuit according to claim 1, wherein said interrupter comprises a second switching device connected to said switching device of said switching power source, a control connected to said second switching device for controlling ON-OFF switchings of said second switching device, and a time measuring device, connected to said control device which measures the predetermined period of time upon said detectors detecting at least one of the two occurrences, said control device rendering said second switching device OFF during the predetermined period of time measured by said time measuring device, whereby application of the input voltage to said switching device is interrupted for the predetermined period of time.

6. The protective circuit according to claim 5, wherein said time measuring device comprises a monostable multivibrator having a trigger terminal applied with the trigger signal.

7. The protective circuit according to claim 1, wherein said detecting device comprises a first current detector which detects the current flowing in said primary winding of said transformer and outputs a primary winding current indicative of the current detected by said first current detector, a second current detector which detects the current flowing in the load connected to said rectifier and outputs a load current indicative of the current detected by said second current detector, and a comparator which compares the primary winding current with the first reference value and which compares the load current with the second reference value, said comparator outputting a trigger signal when comparison results indicate that at least one of the primary winding current and the load current exceeds the first reference value or the second reference value, and wherein said interrupter comprises a second switching device connected to said switching device of said switching power source, a controller connected to said second switching device, which controls ON-OFF switchings of said second switching device, and a time measuring device, connected to said controller, which measures the predetermined period of time in response to the trigger signal, said controller rendering said second switching device OFF during the predetermined period of time measured by said time measuring device so that application of the input voltage to said switching device is interrupted for the predetermined period of time.

8. The protective circuit according to claim 7, wherein said comparator comprises a first comparison device which compares the primary winding current with the first reference value and provides a first comparison result, a second comparison device which compares the load current with the second reference value and provides a second comparison result, and an OR gate having a first input connected to said first comparator to receive the first comparison result and a second input connected to said second comparator to receive the second comparison result, said OR gate outputting an ORed signal of the first comparison result and the second comparison result as the trigger signal.

9. The protective circuit according to claim 8, wherein said first current detecting device comprises a resistor coupled to said primary winding of said transformer so that the primary winding current flows in said resistor, and a differentiator which differentiates a voltage developed across said resistor to detect an inrush current flowing in said primary winding of said transformer immediately after said switching device of said switching power source is rendered ON.

10. A protective circuit as claimed in claim 1, wherein the first predetermined reference value is independent of the current flowing in the load.

11. A protective circuit as claimed in claim 1, wherein the predetermined reference value is independent of the current flowing in the load.

12. A protective circuit for a switching power source which includes a switching device which switches an input voltage applied to said switching device, a transformer having a primary winding coupled to said switching device and a secondary winding, and a rectifier coupled to said secondary winding of said transformer, a load being connectable to said rectifier, said protective circuit comprising:

a detector circuit which compares a current flowing in said primary winding and a current flowing in said load to a predetermined reference value to detect a first occurrence when said current flowing in said primary winding of said transformer exceeds said predetermined reference value and a second occurrence when said current flowing in the load connected to said rectifier exceeds said predetermined reference value; and an interrupter which interrupts application of the input voltage to said switching device for a predetermined period of time when said detector detects at least one of the two occurrences.

13. The protective circuit according to claim 12, wherein said detector comprises a resistor coupled to said primary winding of said transformer so that the primary winding current flows in said resistor, and a differentiator which differentiates a voltage developed across said resistor to detect an inrush current flowing in said primary winding of said transformer immediately after said switching device of said switching power source is rendered ON.

14. The protective circuit according to claim 13, wherein said interrupter comprises a second switching device connected to said switching device of said switching power source, a controller connected to said second switching device, and a time measuring device connected to said controller, which measures the predetermined period of time upon said detector detecting at least one of the two occurrences, said controller rendering said second switching device OFF during the predetermined period of time measured by said time measuring device so that application of the input voltage to said switching device is interrupted for the predetermined period of time.

15. The protective circuit according to claim 14, wherein said time measuring device comprises a monostable multivibrator having a trigger terminal applied with the trigger signal.

16. A stabilized voltage source circuit comprising:

a switching power source including an oscillation circuit for producing a train of pulses, a power transistor having a base connected to said oscillation circuit, a collector, and an emitter, a transformer having a primary winding, and a secondary winding, the primary winding having one end connected to the collector of said power transistor and another end supplied with the input voltage, a rectifying circuit connected to the secondary winding of said transformer, said rectifying circuit rectifying the voltage developed across the secondary winding of said transformer and producing a rectified voltage, and a feedback circuit which feeds back the rectified voltage to the oscillation circuit;

a detector circuit which compares a current flowing in said primary winding to a first predetermined reference value and a current flowing in said load to a second predetermined reference value to detect a first occurrence when said current flowing in said primary winding of said transformer exceeds said first predetermined reference value, and a second occurrence when said current flowing in the load connected to said rectifying circuit exceeds said second predetermined reference value; and an interrupting device which interrupts application of the input voltage to said switching power source for a predetermined period of time when said detector detects at least one of the two occurrences.

17. The protective circuit according to claim 16, wherein said detector comprises a resistor coupled to said primary winding of said transformer so that the primary winding current flows in said resistor, and a differentiator which differentiates a voltage developed across said resistor to detect an inrush current flowing in said primary winding of said transformer immediately after said switching power source is rendered ON.

18. A stabilized voltage source circuit as claimed in claim 16, wherein the first predetermined reference value is independent of the current flowing in the load.

19. A stabilized voltage source circuit comprising:

a switching power source including an oscillation circuit for producing a train of pluses, a power transistor having a base connected to said oscillation circuit, a collector, an emitter, a transformer having a primary winding, and a secondary winding, the primary winding having one end connected to the collector of said power transistor and another end supplied with the input voltage, a rectifying circuit connected to the secondary winding of said transformer, said rectifying circuit rectifying the voltage developed across the secondary winding of said transformer and producing a rectified voltage, and a feedback circuit which feeds back the rectified voltage to the oscillation circuit;

a detecting circuit which compares a current flowing in said primary winding of said transformer and a current flowing in said secondary winding of said transformer to a predetermined value to detect a first occurrence when at least one of said current flowing in said primary winding of said transformer exceeds said predetermined reference value and a second occurrence when said current flowing in the load connected to said rectifying circuit exceeds said predetermined reference value; and an interrupting device which interrupts application of the input voltage to said switching power source for a predetermined period of time when said detector detects at least one of the two occurrences.

20. The protective circuit according to claim 19, wherein said detector comprises a resistor coupled to said primary winding of said transformer so that the primary winding current flows in said resistor, and a differentiator which differentiates a voltage developed across said resistor to detect an inrush current flowing in said primary winding of said transformer immediately after said switching power source is rendered ON.

21. A stabilized voltage source circuit as claimed in claim 19, wherein the predetermined reference value is independent of the current flowing in the load.

* * * * *